United States Patent [19]
Gross et al.

[11] Patent Number: 5,504,443
[45] Date of Patent: Apr. 2, 1996

[54] DIFFERENTIAL LATCH SENSE AMLIFIERS USING FEEDBACK

[75] Inventors: Eric Gross, Colorado Springs, Colo.; Cathal G. Phelan, Santa Clara, Calif.

[73] Assignee: Cypress Semiconductor Corp., San Jose, Calif.

[21] Appl. No.: 301,657

[22] Filed: Sep. 7, 1994

[51] Int. Cl.$^6$ .................. H03K 5/24; H03K 3/26; G11C 7/00
[52] U.S. Cl. .................. 327/51; 327/52; 327/54; 327/55; 327/185; 365/207
[58] Field of Search .................. 327/51, 52, 53, 327/54, 55, 56, 57, 185, 198; 365/205, 207, 203; 326/56, 57, 58

[56] References Cited

U.S. PATENT DOCUMENTS

| | | | |
|---|---|---|---|
| 4,027,176 | 5/1977 | Heuber et al. | 327/55 |
| 4,247,791 | 1/1981 | Rovell | 327/55 |
| 4,843,264 | 6/1989 | Galbraith | 365/207 |
| 4,910,713 | 3/1990 | Madden et al. | 327/52 |
| 5,155,397 | 10/1992 | Fassino et al. | 327/55 |
| 5,160,861 | 11/1992 | Lee | 327/51 |
| 5,192,878 | 3/1993 | Miyamoto et al. | 327/51 |
| 5,231,318 | 7/1993 | Reddy | 327/51 |
| 5,276,369 | 1/1994 | Hayakawa et al. | 307/530 |
| 5,345,121 | 9/1994 | Itoh | 327/55 |

Primary Examiner—Timothy P. Callahan
Assistant Examiner—Eunja Shin
Attorney, Agent, or Firm—Blakely, Sokoloff, Taylor & Zafman

[57] ABSTRACT

A differential latch sense amplifier for memories has (a) a first differential input circuit for detecting and shifting the voltage levels of the first and second input signals and coupled to first and second sense nodes, (b) a cross-coupled latch for providing gain to the first and second sense nodes, (c) a precharge circuit for precharging and equalizing the first and second sense nodes, (d) a first tristatable output driver for providing a first feedback, for outputting the voltage of the first sense node to a first output node, and for receiving data, (e) a second tristatable output driver for providing a second feedback, for outputting the voltage of the second sense node to a second output node, and for receiving data, and (f) a first feedback circuit for increasing the voltage gain and decreasing the sense output response time at the first and second sense nodes and for being controlled by the first and second tristatable output drivers. The feedback circuit is coupled to the first and second tristatable output drivers in such a way that the feedback circuit is disabled during a standby period or between read or write cycles. To minimize layout area, the differential latch sense amplifier may further include a second differential input circuit and a second feedback circuit sharing the cross-coupled latch and precharge circuits. To write data into the memory cells, the differential latch sense amplifier has data transfer pass gates controlled by a west write circuit and an east write circuit.

20 Claims, 8 Drawing Sheets

DIFFERENTIAL LATCH SENSE AMLIFIERS USING FEEDBACK

BACKGROUND OF THE INVENTION

1. Field of the Invention

The present invention relates to the field of memories and, particularly, to sense amplifiers for a memory array.

2. Description of Related Art

Sense amplifiers are used to detect small differential signals generated by memory cells and to shift the voltage levels of the memory cell output signals to a magnitude compatible with the other output circuitry in a memory chip. Smallest possible transistors are incorporated in the memory array to make memory chips cost-effective. Memory cell sizes and the corresponding memory cell output signals are reduced as array density is increased to maintain cost effectiveness. As a result, sense amplifiers are required to be very sensitive to small differences in input signals coming from the memory cells, be as fast as possible, and not consume a large portion of layout area.

Conventionally, small memory cell signals are detected with a differential amplifier. A prior art differential amplifier 15 is shown in FIG. 1. Transistors T1 and T2 form the differential input pair receiving input signals from the memory cells. Transistor T3 is used to enable and bias amplifier 15. A reference voltage generator 12 is used to increase the differential amplifier's sensitivity to changes in input differential by maintaining an optimum voltage at the common node (10) of differential input pair T1 and T2. Supply currents I1 and I2 are generated in a variety of fashions, but most typically with two transistors in a current mirror arrangement. Although this circuit is relatively fast, reference voltage generator 12 used to bias amplifier 15 uses chip current, is sensitive to process variations, and uses additional chip area. In addition, amplifier 15 itself has a relatively low gain.

Another prior art amplifier configuration shown in FIG. 2 eliminates reference voltage generator 12 by using a dual current mirror differential arrangement to split the supply current into "drive" paths 21 and 22 as well as "reference" paths 23 and 24. In this manner, amplifier 25 is self-biased. This type of amplifier shown in FIG. 2 is relatively stable over process variations, is sensitive to small input signal levels, but still requires a sizable layout area and has a relatively low gain. Additional differential sense stages are often required to buffer output signals 28 and 29 to levels where conventional CMOS logic can be effectively used. Until the sensed levels are buffered to near supply rail values, the subsequent circuitry in the critical path uses DC power.

SUMMARY OF THE INVENTION

The present invention provides a differential latch sense amplifier for memories having (a) a first differential input circuit for detecting and shifting the voltage levels of the first and second input signals and coupled to first and second sense nodes, (b) a cross-coupled latch for providing gain to the first and second sense nodes, (c) a precharge circuit for precharging and equalizing the first and second sense nodes, (d) a first tristatable output driver for providing a first feedback, for outputting the voltage of the first sense node to a first output node, and for receiving data, (e) a second tristatable output driver for providing a second feedback, for outputting the voltage of the second sense node to a second output node, and for receiving data, and (f) a first feedback circuit for increasing the voltage gain and decreasing the sense output response time at the first and second sense nodes and for being controlled by the first and second tristatable output drivers.

The feedback circuit is coupled to the first and second tristatable output drivers in such a way that the gates of the feedback circuit do not float during a standby period or between read and write cycles.

To minimize layout area, the differential latch sense amplifier may further include (g) a second differential input circuit for detecting a third and fourth input signals and for shifting the voltage levels of the third and fourth input signals and (h) a second feedback circuit for increasing the voltage gain and the sense output response time at the first and second sense nodes and for being controlled by the first and second tristatable output drivers so that the first and second differential input circuits and the first and second feedback circuits share the cross-coupled latch and the first precharge circuit wherein the first differential input circuit and first feedback circuit are not active simultaneously with the second differential input circuit and second feedback circuit.

The first differential input circuit and first feedback circuit are used to read data from a first block of memory cells (designated as a "west" block) while the second differential input circuit and second feedback circuit are used to read data from a second block of memory cells (designated as an "east" block).

To write data into the memory cells, the differential latch sense amplifier may include (i) a west write circuit having (1) a first pass circuit for being controlled by a west write signal and for transferring a signal at the second output node to the gate of a first n-channel transistor of the first differential input circuit and (2) a second pass circuit for being controlled by the west write signal and for transferring a signal at the first output node to the gate of a second n-channel transistor of the first differential input circuit and (j) an east write circuit having (1) a third pass circuit for being controlled by an east write signal and for transferring a signal at the second output node to the gate of a first n-channel transistor of the second differential input circuit and (2) a fourth pass circuit for being controlled by the east write signal and for transferring a signal at the first output node to the gate of a second n-channel transistor of the second differential input circuit.

DETAILED DESCRIPTION OF THE PRESENT INVENTION

In the detailed descriptions which follow, a notation $\overline{XXX}$ is used to indicate that $\overline{XXX}$ is a complimentary signal of XXX. A circuit designer may denote a signal to be $\overline{XXX}$ or XXX by choice.

Figure 1:
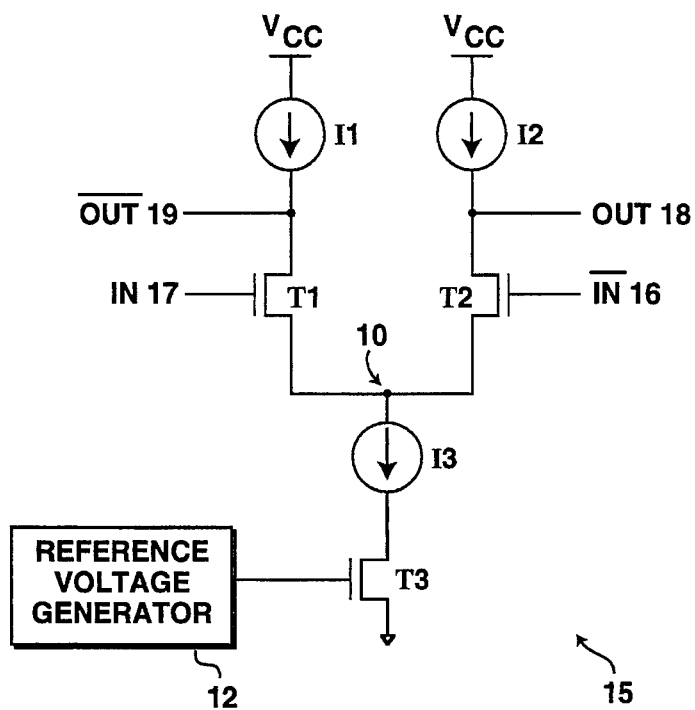
FIG. 1 presents a schematic diagram of a prior art differential amplifier having a reference voltage generator.
Figure 2:
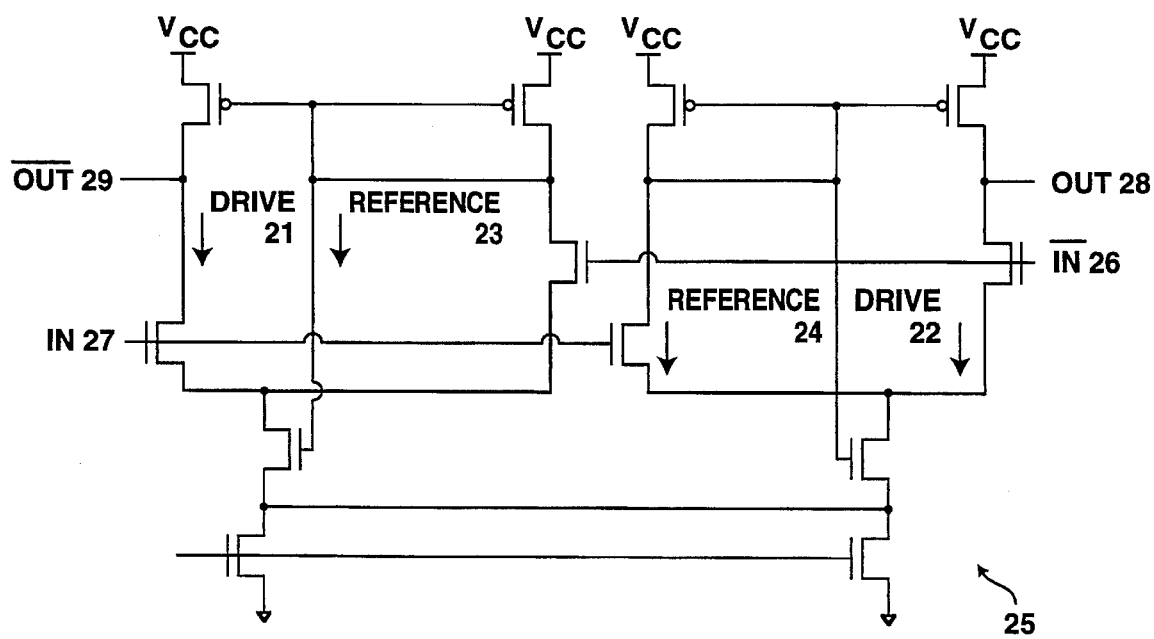
FIG. 2 presents a schematic diagram of another prior art differential amplifier which generates its own reference voltage.
Figure 3A:
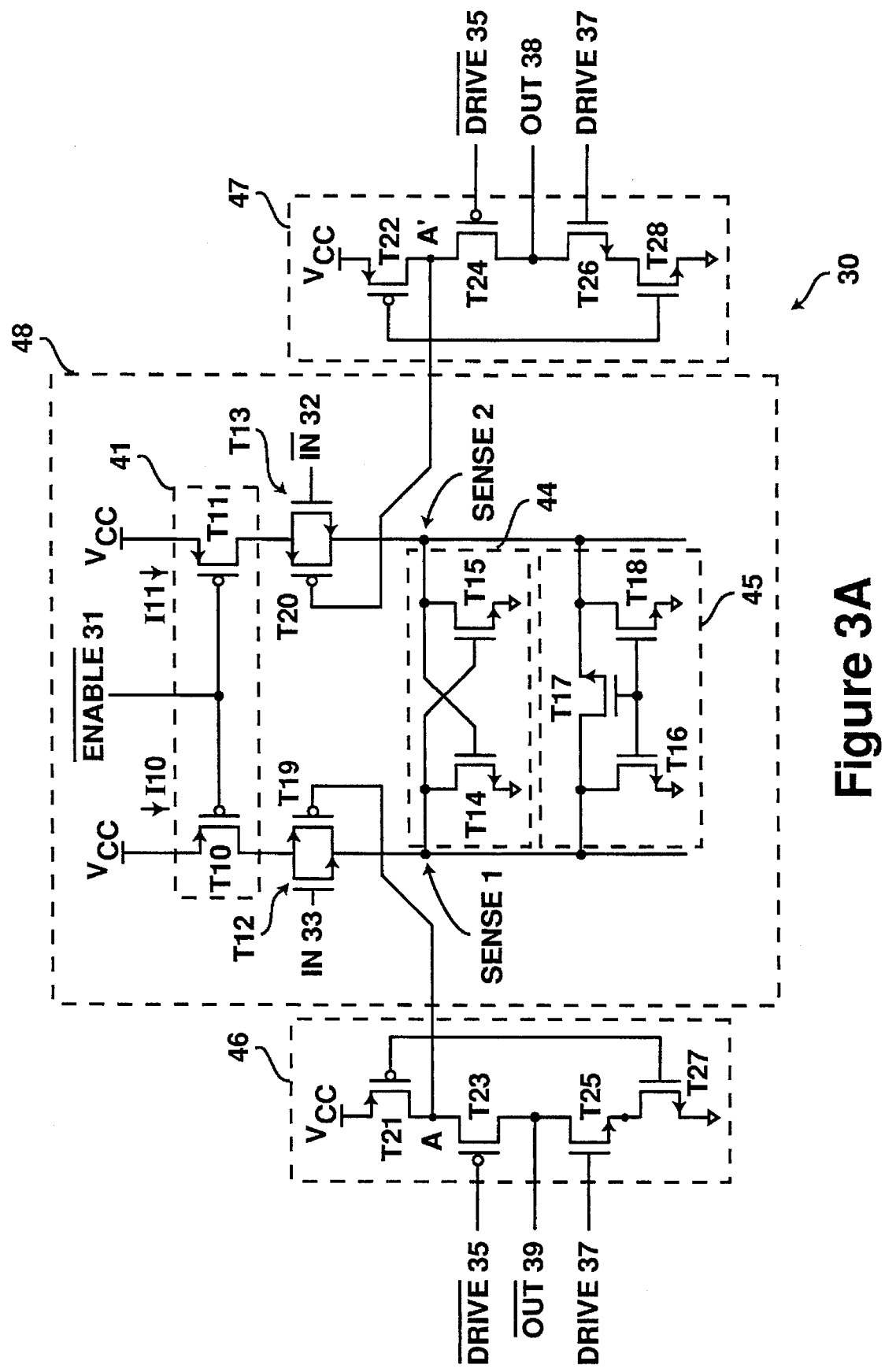
FIG. 3A presents a schematic diagram of a differential latch sense amplifier having a feedback circuit according to a first embodiment of the present invention.

FIG. 3A presents a differential latch sense amplifier 30 according to the present invention. Differential latch sense amplifier 30 provides a large voltage gain and a fast sense output response time at sense nodes 1 and 2, has good sensitivity to small signal inputs, avoids the need for a separate bias generator, and conserves layout area. Differential latch sense amplifier 30 has tristatable output drivers 46 and 47 and a sense stage 48.

Tristatable output drivers 46 and 47 including transistors T21, T23, T25, T27, T22, T24, T26 and T28 invert and transfer the signals at sense nodes 1 and 2 to output nodes 38 and 39. Tristatable output drivers 46 and 47 allow data multiplexing by having output nodes $\overline{OUT}$ 39 and OUT 38 coupled to multiple differential latch sense amplifiers, and the data multiplexing is achieved with a minimum delay and minimum layout area. Minimum delay is accomplished by having only one output stage instead of having two or more stages. Tristatable drivers 46 and 47 also capacitive decouple sense nodes 1 and 2 from output nodes 38 and 39 and drive highly capacitive output nodes 38 and 39. Because sense stage 48 supplies sufficient voltage levels to tristatable output drivers 46 and 47, it avoids substantial DC power consumption in tristatable output drivers 46 and 47. When $\overline{ENABLE}$ 31 becomes inactive, differential latch sense amplifier 30 consumes zero power.

Sense stage 48 includes enable transistors T10 and T11 for decoding and enabling sense stage 48. T10 and T11, which are controlled by an $\overline{ENABLE}$ signal 31, supply currents I10 and I11 to differential input pairs T12 and T13. Transistors T12 and T13 are N-channel transistors that detect small differential input voltage signals from the memory cells and shift input voltage levels. A cross-coupled latch 44 of sense stage 48 includes transistors T14 and T15 for biasing differential input pair T12 and T13 and for providing a voltage gain at sense nodes 1 and 2.

Also provided in sense stage 48 is a precharge circuit 45 including transistors T16, T17 and T18. Transistors T16 and T18 are used to precharge sense nodes 1 and 2 to ground, respectively. Transistor T17 is used to equalize the voltage at sense node 1 to the voltage at sense node 2. Transistors T16, T17 and T18 are controlled by a $\overline{DRIVE}$ signal 35.

Sense stage 48 further includes feedback transistors T19 and T20. T19 and T20 are controlled by tristatable output drivers 46 and 47. Instead of connecting the gates of T19 and T20 to $\overline{IN}$ 32 and IN 33 to receive small differential input signals, as shown in U.S. Pat. No. 5,231,318 issued to Reddy, the present invention connects the gates of feedback transistors T19 and T20 to nodes A and A' in tristatable output drivers 46 and 47, respectively, to provide a larger voltage gain and a faster sense output response time at sense nodes 1 and 2.

Figure 3B:
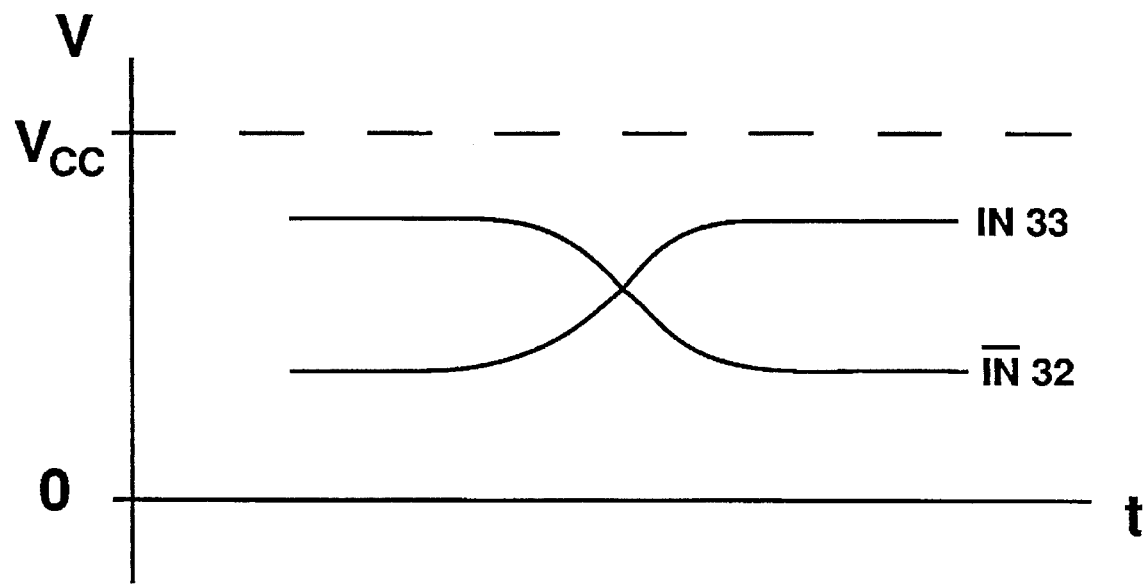
FIG. 3B presents voltage waveforms at nodes 32 and 33 in FIG. 3A.

If transistors T19 and T20 are coupled to $\overline{IN}$ 32 and IN 33, respectively, then transistors T19 and T20 receive small differential input signals, as shown in FIG. 3B, since memory cells typically consist of small transistors. Tristatable output drivers 46 and 47, on the other hand, can be large devices since a memory chip needs significantly less number of tristatable output drivers than the number of memory cell transistors. For example, if a memory chip has M×N memory cells, each memory cell having 4–6 transistors, then there are at least M×N×4 memory cell transistors where M is the number of the rows and N is the number of the columns in the memory array. Since a memory chip typically requires only N/8 to N/32 number of tristatable output driver pairs, each pair having 8 transistors, the memory chip will only require N (which is N/8×8) or N/4 (which is N/32 ×8) number of tristatable output driver transistors in comparison to M×N×4 number of memory cells.

Figure 3C:
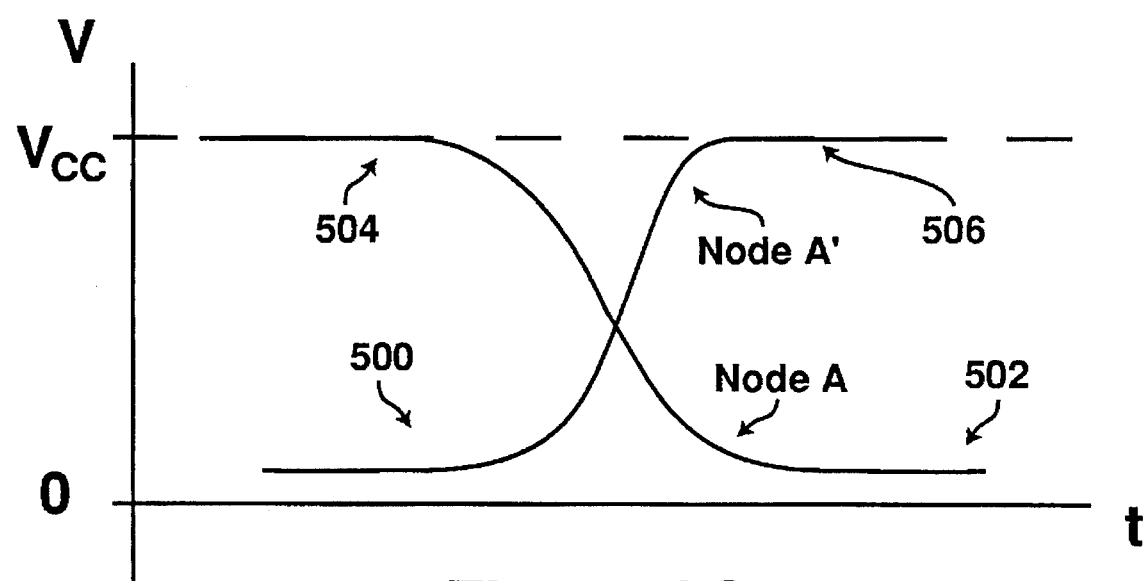
FIG. 3C presents voltage waveforms at nodes A and A' in FIG. 3A.

Because tristatable output drivers 46 and 47 are large devices, tristatable output drivers 46 and 47 can provide larger differential input signals to transistors T19 and T20, as shown in FIG. 3C, in contrast to the small input signals received from the memory cells, as shown in FIG. 3B, and it can drive transistors T19 and T20 harder. Referring to FIGS. 3A and 3C, while cross-coupled transistors T14 and T15 can bring the voltage levels of sense nodes 1 and 2 to low logic levels that are close to ground (regions 500 and 502), feedback transistors T19 and T20 can bring the voltage levels of sense nodes 1 and 2 to high logic levels that are substantially that of $V_{cc}$ (regions 504 and 506).

As a result, because the gates of feedback transistors T19 and T20 are coupled to tristatable output drivers, T19 and T20 can provide larger voltage gains at sense nodes 1 and 2 than a circuit having its feedback transistors coupled to IN 33 and $\overline{IN}$ 32. Furthermore, because transistors T19 and T20 are driven harder by tristatable output drivers 46 and 47, T19 and T20 can provide faster sense output responses at sense nodes 1 and 2 than the circuit having its feedback transistors coupled to IN 33 and $\overline{IN}$ 32.

In addition, because sense nodes 1 and 2 are precharged and equalized to ground by precharge circuit 45, transistors T12 and T13 can be turned on faster. Since the sources of T12 and T13 are at ground, the voltage levels at IN 33 and $\overline{IN}$ 32 need only be the threshold voltage (typically 0.7 Volt) to turn on T12 and T13. If sense nodes 1 and 2 are floating or at a voltage greater than ground, then to turn on T12 and T13, IN 33 and $\overline{IN}$ 32 must be larger than a sum of the threshold voltage and the voltage at sense node 1 and sense node 2, respectively.

To prevent the gate of feedback transistor T19 from floating, the gate of T19 is specifically connected to node A, T23 and T25 controlled by the drive signals are located in the mid section of driver 46, and T21 and T27 controlled by sense node 1 are placed in the end sections of driver 46. To prevent the gate of feedback transistor T20 from floating, the gate of T20 is specifically connected to node A', T24 and T26 controlled by the drive signals are located in the mid section of driver 47, and T22 and T28 controlled by sense node 2 are placed in the end sections of driver 47.

How the present invention prevents the gates of feedback transistors T19 and T20 from floating during a standby or precharge period is described below. During a standby period, in which IN 33 and $\overline{\text{IN}}$ 32 do not receive valid input signals, $\overline{\text{DRIVE}}$ 35 is inactive (1), turning on precharge transistors T16, T17 and T18. Sense nodes 1 and 2 are at ground (0), turning on transistors T21 and T22 and turning off transistors T27 and T28. Because $\overline{\text{DRIVE}}$ 35 is high and DRIVE 37 is low, transistors T23, T25, T24 and T26 are off. However, because transistors T21 and T22 are on, the gates of T19 and T20 are at $V_{cc}$ (not floating), and T19 and T20 are off.

Figure 3D:
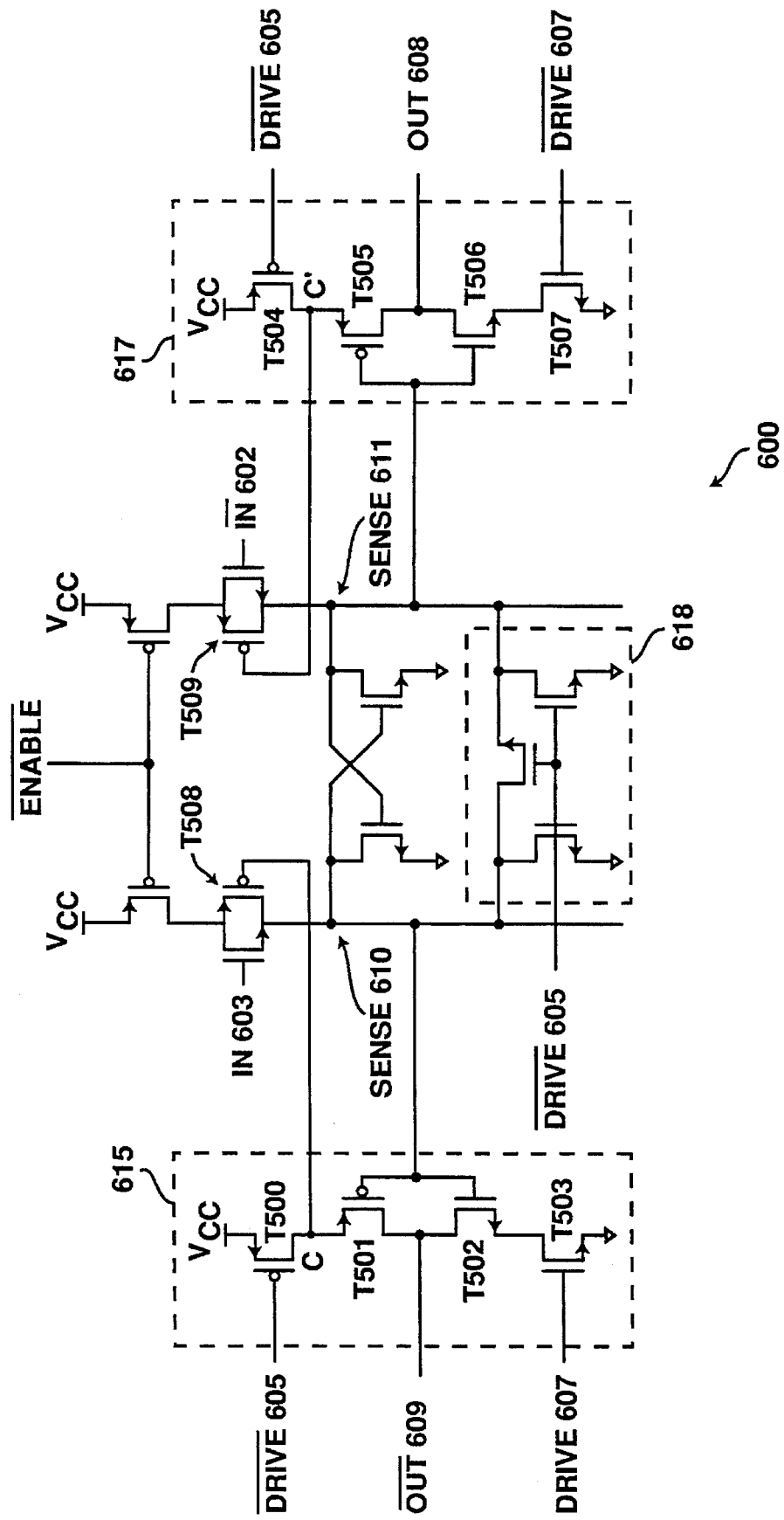
FIG. 3D presents a schematic diagram to illustrate the significance of having tristatable output drivers shown in FIG. 3A.

FIG. 3D illustrates the importance of having tristatable output drivers 46 and 47 in the configuration shown in FIG. 3A to prevent the gates of feedback transistors T19 and T20 from being driven by indeterminate logic levels on nodes $\overline{\text{OUT}}$ 609 and OUT 608, respectively. In FIG. 3D, tristatable output drivers 615 and 617 are configured in such a way that T500 and T504 are coupled to a $\overline{\text{DRIVE}}$ 605, T501 and T502 are coupled to a sense node 610, T503 and T507 are coupled to a DRIVE 607, T505 and T506 are coupled to a sense node 611, and the gates of feedback transistors T508 and T509 are connected to C and C', respectively. In differential latch sense amplifier 600 of FIG. 3D, the gates of T508 and T509 float during a standby or precharge period. During the standby or precharge period, when $\overline{\text{DRIVE}}$ 605 becomes inactive (1), precharge circuit 618 becomes active, pulling sense nodes 610 and 611 to ground, turning on T501 and T505, and turning off T502 and T506. Since $\overline{\text{DRIVE}}$ 605 is high and DRIVE 607 is low, T500, T504, T503 and T507 are off. Thus, nodes C and C' are controlled by whatever logic levels that are on the common I/O lines OUT 608 and $\overline{\text{OUT}}$ 609 since T501 and T505 are on. As a result, T508 and T509 cannot be guaranteed to be off during this period.

A typical read cycle for differential latch sense amplifier 30 in FIG. 3A includes the following steps. Referring to FIG. 3A, $\overline{\text{ENABLE}}$ 31 becomes high to disable sense stage 48. Simultaneously or after a minimum delay, $\overline{\text{DRIVE}}$ 35 becomes high, and DRIVE 37 becomes low. Sense nodes 1 and 2 are precharged to ground by transistors T16 and T18, and transistor T17 equalizes sense node 1 and sense node 2 to the same voltage. Because sense nodes 1 and 2 are at ground (0), transistors T21 and T22 are on, pulling nodes A and A' to $V_{cc}$, and thus turning off T19 and T20. Subsequently, $\overline{\text{ENABLE}}$ 31 becomes low, and enable transistors T10 and T11 supply power to sense stage 48.

Next, small differential input signals are provided to IN 33 and $\overline{\text{IN}}$ 32. $\overline{\text{DRIVE}}$ 35 and DRIVE 37 become active: $\overline{\text{DRIVE}}$ 35 becomes low, and DRIVE 37 becomes high. Sense nodes 1 and 2 are no longer pulled down to ground by T16, T17 and T18. Until now, T19 and T20 were off. Once transistors T12 and T13 receive input signals from IN 33 and $\overline{\text{IN}}$ 32, respectively, nodes A and A' follow their respective voltages corresponding to sense nodes 1 and 2. Either T19 or T20 turns on. For instance, if IN 33 has a higher voltage level than $\overline{\text{IN}}$ 32, then sense node 1 is pulled up to a voltage level sufficient to maintain a low voltage level on sense node 2 through cross-coupled transistor T15. Sense node 1 turns on T27, and T23 and T25 are on because $\overline{\text{DRIVE}}$ 35 is low and DRIVE 37 is high. Thus, node A is pulled down, and T19 is on. Because the devices in tristatable output driver 46 are large, T19 is driven hard, and sense node 1 is pulled up to $V_{cc}$ fast.

For transistor T20, because transistor T13 has insufficient drive to overpower the cross-coupled transistor T15 holding sense node 2 low, sense node 2 stays low, and T22 is turned on, pulling up node A' and keeping T20 off. Therefore, while sense node 1 is fully pulled up to $V_{cc}$, sense node 2 remains almost at ground, as shown as regions 500 and 502 in FIG. 3C. Transistor T19 helps sense node 1 to pull up to $V_{cc}$ fast, and thus $\overline{\text{OUT}}$ 39 is pulled down to ground fast as well. Similarly, if $\overline{\text{IN}}$ 32 has a higher voltage level than IN 33, then due to the symmetry of the amplifier, OUT 38 will be quickly pulled down to ground.

Upon completion of the read cycle, $\overline{\text{ENABLE}}$ 31, $\overline{\text{DRIVE}}$ 35, and DRIVE 37 signals bring sense nodes 1 and 2 to ground, pull nodes A and A' to $V_{cc}$, and turn off T19 and T20 to precharge the amplifier in preparation for the next active cycle.

Figure 4:
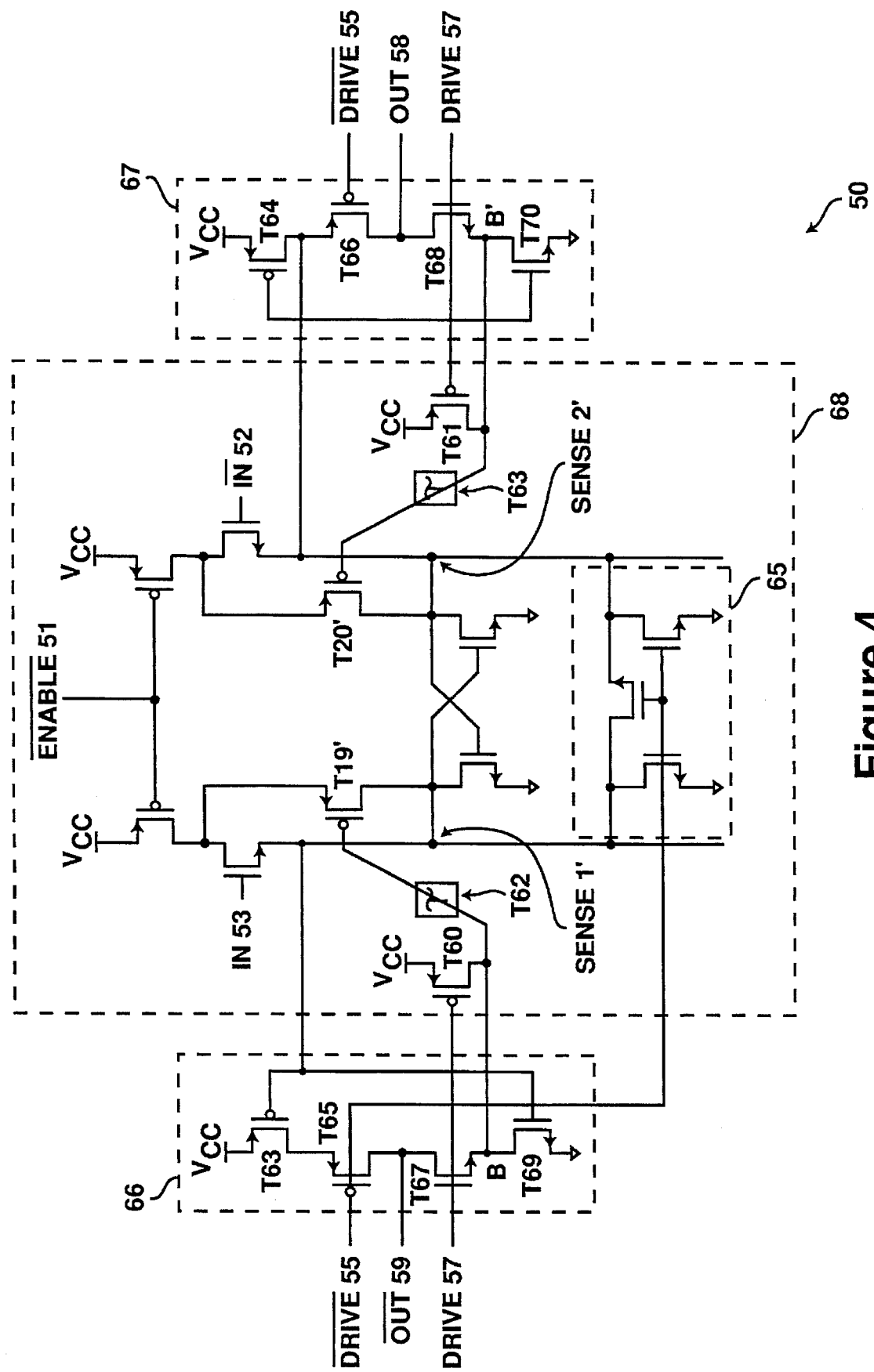
FIG. 4 presents a schematic diagram of a differential latch sense amplifier having a feedback circuit according to a second embodiment of the present invention.

A second embodiment of the present invention is shown in FIG. 4. In the second embodiment, feedback transistors T19' and T20' are connected to nodes B and B' (instead of A and A' as shown in FIG. 3A). Because transistors T19' and T20' are connected to nodes B and B', two additional small P-channel pull-up transistors T60 and T61 gated by DRIVE 57 are necessary to prevent nodes B and B' from floating. Without transistors T60 and T61, when a precharge circuit 65 precharges and equalizes sense nodes 1' and 2' to ground, transistors T63 and T64 are on while transistors T69 and T70 are off. Because $\overline{\text{DRIVE}}$ 55 and DRIVE 57 are inactive, transistors T65, T66, T67 and T68 are off. Thus, B and B' are floating during this time. To avoid nodes B and B' from floating, transistors T60 and T61 are added. When DRIVE 57 is inactive (0), pull-up transistors T60 and T61 are on, pulling nodes B and B' to $V_{cc}$ and disabling transistors T19' and T20'.

Delay circuits T62 and T63 may be necessary to slow the gate activation of P-channel feedback transistors T19' and T20', should sense nodes 1' and 2' enable transistors T69 and T70 too quickly. If transistors T69 and T70 of tristatable output drivers 66 and 67 are activated too rapidly, P-channel feedback transistors T19' and T20' may interfere with cross-coupled latch sensing operation of sense stage 68.

Figure 5:
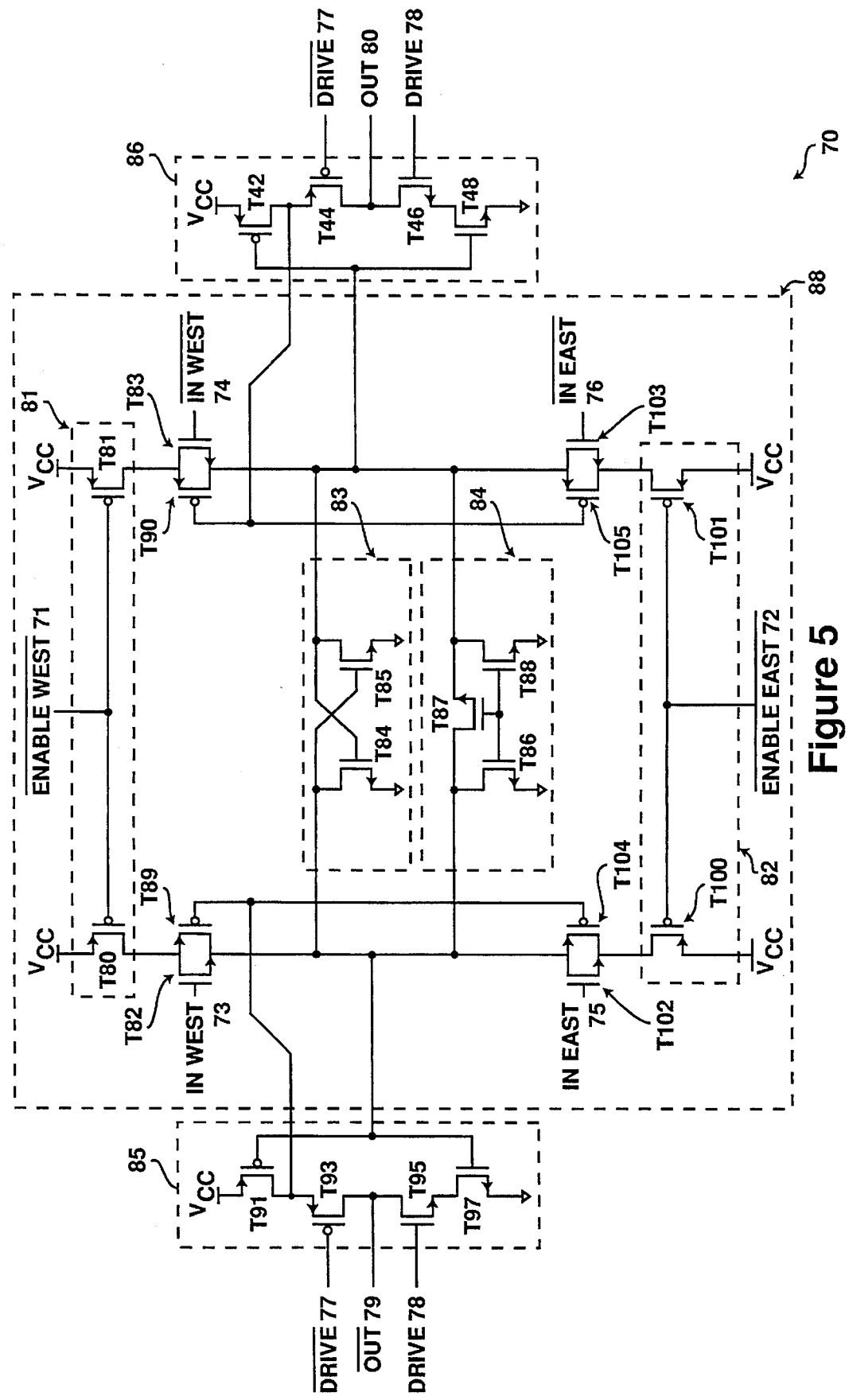
FIG. 5 presents a schematic diagram of a differential latch sense amplifier having two sets of differential input pairs and feedback circuits sharing one cross-coupled circuit and one precharge circuit according to the present invention.

A third embodiment of the present invention shown in FIG. 5 presents (a) a west side circuit including an enable circuit 81, a differential input pair T82 and T83, and P-channel feedback transistors T89 and T90 and (b) an east side circuit including an enable circuit 82, a differential input pair T102 and T103, and P-channel feedback transistors T104 and T105. The west side and east side circuits share a cross-coupled latch 83, a precharge circuit 84 and tristatable output drivers 85 and 86 to provide layout area savings. INWEST 73 and $\overline{\text{INWEST}}$ 74 are connected to a first block of memory cells (a west block), and INEAST 75 and $\overline{\text{INEAST}}$ 76 are connected to a second block of memory cells (an east block).

Differential latch sense amplifier 70 is equivalent to two differential latch amplifiers 30 in FIG. 3A except that differential latch sense amplifier 70 has only one cross-coupled latch 83, only one precharge circuit 84 and one pair of tristatable output drivers 85 and 86. $\overline{\text{ENABLEWEST}}$ 71 and $\overline{\text{ENABLEEAST}}$ 72 are used to determine which half of the amplifier is to be active. For instance, if $\overline{\text{ENABLEWEST}}$ 71 is active (0), then the west side circuit including T80, T81, T82, T83, T89 and T90 are selected. On the other hand, if $\overline{\text{ENABLEEAST}}$ 72 is active, then the east side circuit including T100, T101, T102, T103, T104 and T105 are selected. $\overline{\text{ENABLEWEST}}$ 71 is never simultaneously active with $\overline{\text{ENABLEEAST}}$ 72.

Figure 6:
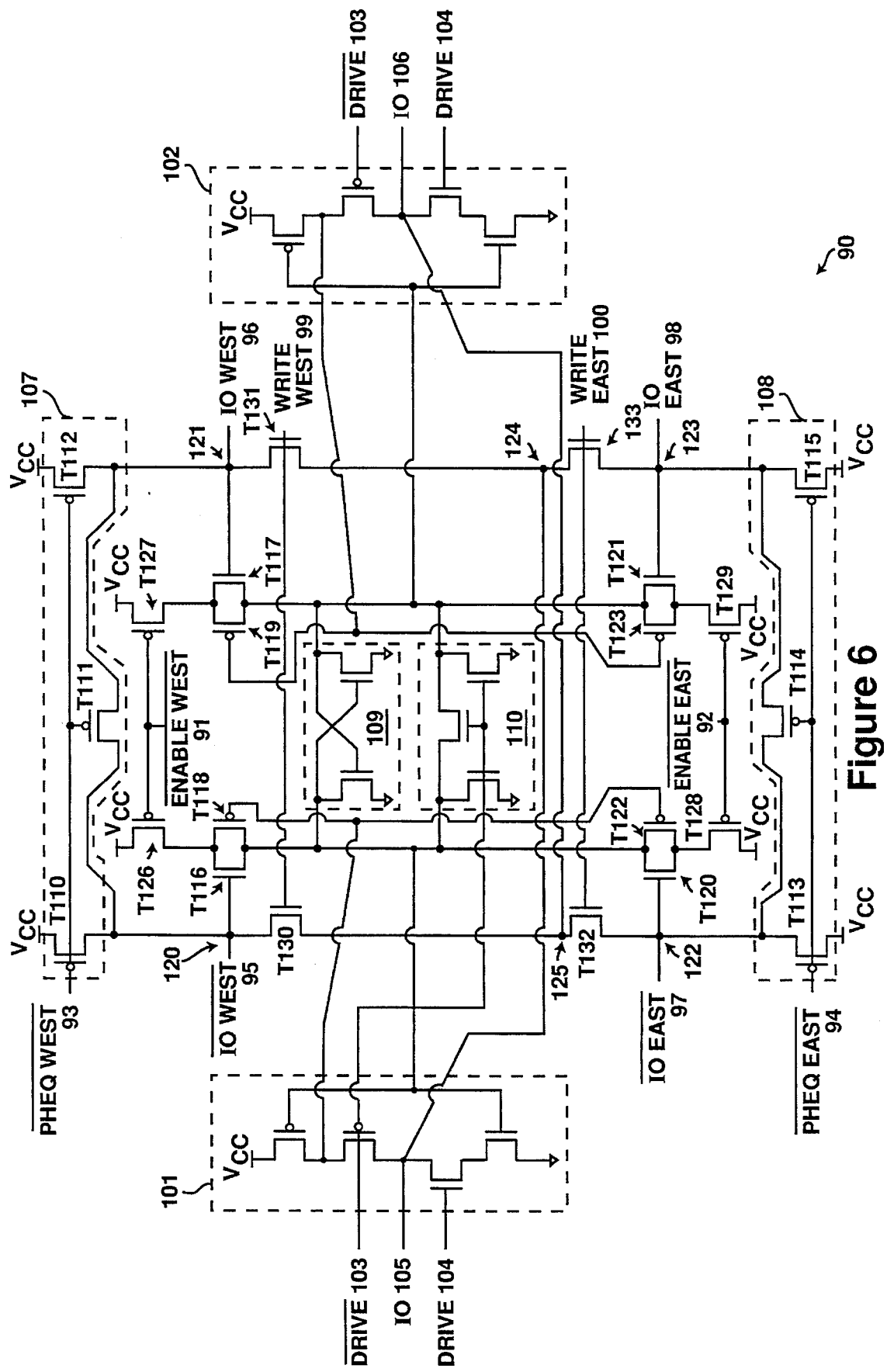
FIG. 6 is a schematic diagram of a differential latch sense amplifier having dual differential input pairs, feedback circuits and write circuits according to the preferred embodiment of the present invention.

While differential latch sense amplifiers in FIGS. 3A, 4 and 5 are used to read data from memory cells and transmit data out through tristatable output drivers, differential latch sense amplifier 90 in FIG. 6 is used to read and write data into memory cells. Differential latch sense amplifier 90 is substantially that of differential latch sense amplifier 70 in FIG. 5 except that differential latch sense amplifier 90 includes (a) IO 105 and $\overline{\text{IO}}$ 106 to receive data into differential latch sense amplifier 90 and to send data out from differential latch sense amplifier 90, (b) $\overline{\text{IOWEST}}$ 95 and IOWEST 96 to receive data from memory cells connected to a first block of memory cells and to write data to the first block of memory cells, and $\overline{\text{IOEAST}}$ 97 and IOEAST 98 to read and write data into a second block of memory cells.

Differential latch sense amplifier 90 includes (a) a west write circuit having a precharge circuit 107 controlled by $\overline{\text{PHEQWEST}}$ 93, $\overline{\text{IOWEST}}$ 95 and IOWEST 96 connected to nodes 120 and 121, respectively, and pass transistors T130 and T131 controlled by a WRITEWEST 99 and (b) an east write circuit having a precharge circuit 108 controlled by $\overline{\text{PHEQWEST}}$ 94, and $\overline{\text{IOEAST}}$ 97 and IOEAST 98 connected to nodes 122 and 123, respectively, and pass transistors T132 and T133 controlled by a WRITEEAST 100. Precharge circuit 107 precharges and equalizes amplifier input nodes 120 and 121 to $V_{cc}$ during a standby or amplifier setup period prior to sensing signals at nodes 120 and 121. Similarly, precharge circuit 108 precharges and equalizes nodes 122 and 123 to $V_{cc}$ during a standby or amplifier setup period prior to sensing signals at nodes 122 and 123. Equalization transistors T111 and T114 are desirable but are not necessary in this circuit configuration.

Figure 7:
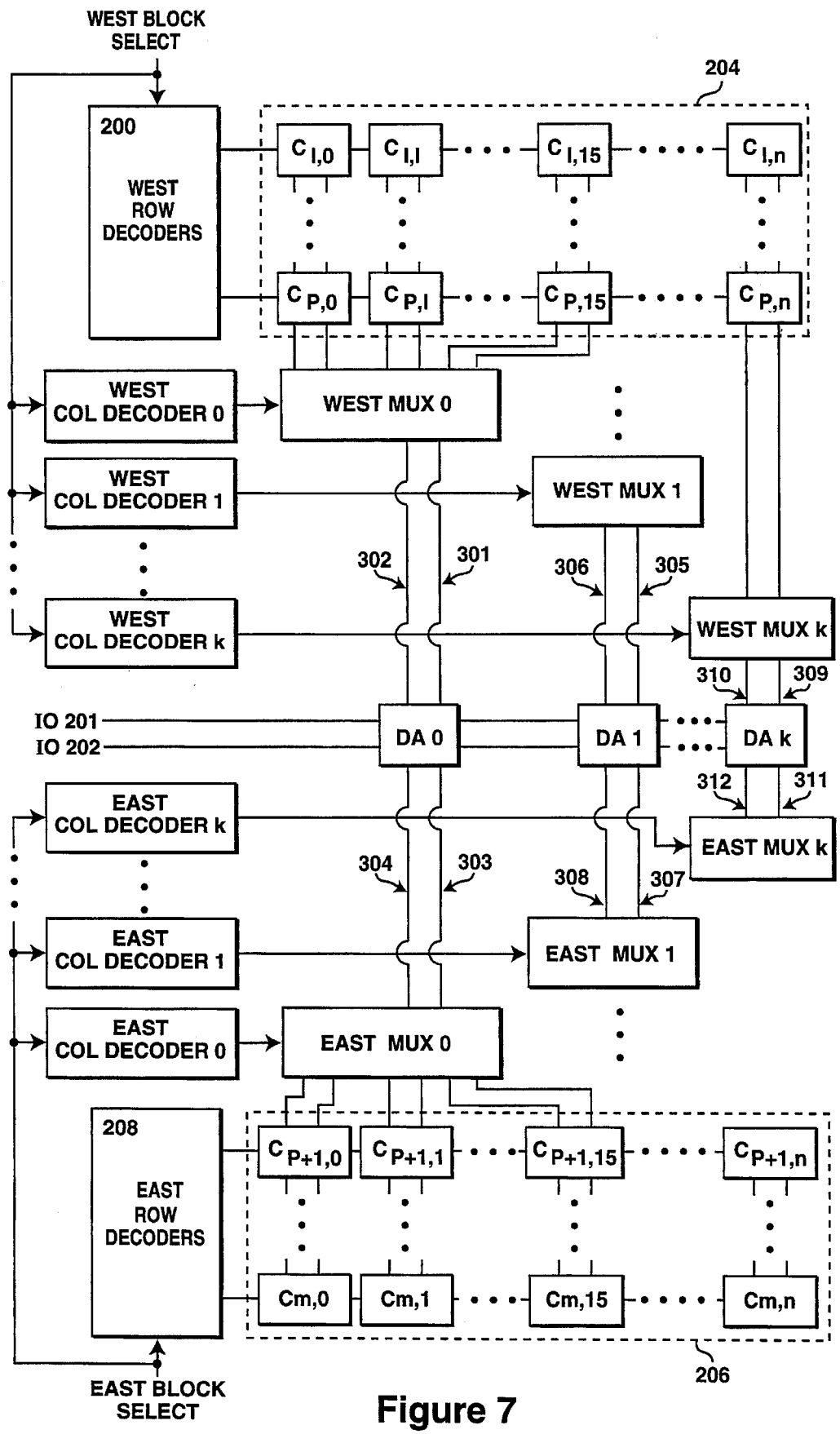
FIG. 7 is a memory system having memory cells in M rows and N columns and N/16 differential latch sense amplifiers according to the preferred embodiment of the present invention.

In differential latch sense amplifier 90, $\overline{\text{IOWEST}}$ 95, IOWEST 96, $\overline{\text{IOEAST}}$ 97, IOEAST 98, IO 105 and $\overline{\text{IO}}$ 106 are used for bi-directional data flow as opposed to using separately dedicated bus lines for data write and read operations. Tristatable output drivers 101 and 102 have the multiplexing capabilities to use IO 105 and $\overline{\text{IO}}$ 106 as input and output lines and to have IO 105 and $\overline{\text{IO}}$ 106 coupled to multiple differential latch sense amplifiers as shown in FIG. 7.

During a read cycle, one of $\overline{\text{ENABLEWEST}}$ 91 or $\overline{\text{ENABLEEAST}}$ 92 is selected, and the read cycle is executed in the same manner as the one described in reference to FIG. 3A.

During a read operation, to read data from a west block of the memory cells, $\overline{\text{ENABLEWEST}}$ 91, T126, T127, T116, T117, T118, T119, a cross-coupled circuit 109, a precharge circuit 110, and tristatable drivers 101 and 102 may be used. To read data from an east block of the memory cells, $\overline{\text{ENABLEEAST}}$ 92, T128, T129, T120, T121, T122, T123, cross-coupled circuit 109, precharge circuit 110, and tristatable drivers 101 and 102 may be used.

A write operation is described below. First, $\overline{\text{ENABLEWEST}}$ 91 and $\overline{\text{ENABLEEAST}}$ 92 become inactive (1) to save power. However, $\overline{\text{ENABLEWEST}}$ 91 and $\overline{\text{ENABLEEAST}}$ 92 may be active (0) to reinforce a write operation. Simultaneously or after a minimum delay, $\overline{\text{DRIVE}}$ 103 becomes high, and DRIVE 104 becomes low. Next, either WRITEWEST 99 or WRITEEAST 100 becomes active (1). If a logic 1 is desired to be written to an east block of memory cells, (WRITEEAST 100=1), IO 105 is 1, and $\overline{\text{IO}}$ 106 is 0, then pass transistors T132 and T133 become active, and data at IO 105 is transmitted to node 124 and reaches IOEAST 98 through T133. Data at $\overline{\text{IO}}$ 106 is transmitted to node 125 and then to $\overline{\text{IOEAST}}$ 97 through T132. If, on the other hand, WRITEWEST 99 is selected, then data at IO 105 is transmitted to 124 and then to IOWEST 96 through T131, and $\overline{\text{IO}}$ 106 is transmitted to node 125 and then to $\overline{\text{IOWEST}}$ 95 through T130.

Between write and read cycles, $\overline{\text{PHEQWEST}}$ 93 is used to precharge nodes 120 and 121 using T110 and T112 and to equalize nodes 120 and 121 together to a predetermined voltage level (e.g., $V_{cc}$) using transistor T111. Although transistors T110, T112, T113, T115 in precharge circuits 107 and 108 are P-channel transistors, one may use N-channel transistors. Equilibration transistors T111 and T114 may be desirable but are not necessary. $\overline{\text{PHEQEAST}}$ 94 is used to precharge nodes 122 and 123 using T113 and T115 and to equalize nodes 122 and 123 to the same voltage using T114.

FIG. 7 shows how differential latch sense amplifiers may be coupled to a memory array including a first block (a west block) 204 and a second block (an east block) 206. Differential latch sense amplifiers (DA0, DA1, etc.) Are connected to IO 201 and $\overline{\text{IO}}$ 202. Each of the differential latch sense amplifiers is connected to one or more columns of memory cells through column decoding multiplexers such as west mux 0, east mux 0, etc.

In the preferred embodiment, DA0 is coupled to the memory cells in columns 0–15 in west block 204 and east block 206 through west mux 0 and east mux 0, respectively. While the preferred embodiment of the present invention incorporates N/32 (N/16 west and N/16 east) differential sense amplifiers where N is the number of the columns in the memory array, the number of differential sense amplifiers employed in a memory system may vary (e.g. N/2, N/8, N/16, etc.) according to the particular architecture.

West row decoders 200 control west block 204, and east row decoders 208 which is identical to west row decoders 200 in structure control east block 206. In operation, if row 1 is to be selected, then west block select becomes active, and east block select becomes inactive so that while west row decoders 200 choose row 1 and east row decoders 208 choose row p+1 at the same time, only row 1 is selected and becomes active. On the other hand, if row p+1 is to be selected, then west block select becomes inactive, and east block select becomes active so that while west row decoders 200 choose row 1 and east row decoders 208 choose row p+1 at the same time, only row p+1 is selected and becomes active.

Each of the column decoders such as west column decoder 0, west column decoder 1, east column decoder 0, etc. allows its corresponding multiplexer to select a column of memory cells. In operation, if west block select is active, west column decoder 0 commands west mux 0 to select column 1, and west row decoders 200 selects row 1, then DA0 senses the logic stored in $C_{1,1}$ through lines 301 and 302. Lines 301 and 302 may correspond to IOWEST 96 and $\overline{\text{IOWEST}}$ 95 in FIG. 6, and lines 303 and 304 may correspond to IOEAST 98 and $\overline{\text{IOEAST}}$ 97 in FIG. 6. Also, IO 201 and $\overline{\text{IO}}$ 202 may correspond to IO 105 and $\overline{\text{IO}}$ 106 in FIG. 6.

It should be noted that although differential latch sense amplifiers 70 and 90 in FIGS. 5 and 6 use the feedback configuration of T19 and T20 of FIG. 3A, differential latch sense amplifiers 70 and 90 may incorporate feedback transistors T19' and T20' as well as T60, T61, T62 and T63 of FIG. 4 instead of T19 and T20.

While the present invention has been particularly described with reference to FIGS. 1 through 7, it should be understood that the figures are for illustration only and should not be taken as limiting the scope of the invention. Many changes and modifications may be made to the invention, by one having ordinary skill in the art, without departing from the spirit and scope of the invention as disclosed herein.

What is claimed is:

1. A sense amplifier comprising:

a first differential input circuit coupled to first and second sense nodes, said first differential input circuit detecting first and second input signals;

a cross-coupled latch coupled to said first and second sense nodes, said cross-coupled latch providing voltage at said first and second sense nodes;

a driver circuit coupled to said first and second sense nodes, said driver circuit outputting said voltage of said first and second sense nodes; and a first feedback circuit controlled by said driver circuit, said first feedback circuit coupled to said driver circuit, to said first differential input circuit and to said first and second sense nodes.

2. The sense amplifier of claim 1 further comprising:

a first precharge circuit coupled to said first and second sense nodes, said first precharge circuit precharging said first and second sense nodes and equalizing the voltage of said first sense node to the voltage of said second sense node wherein said driver circuit comprising:

a first tristatable output driver coupled to said first sense node and to said first feedback circuit, said first tristatable output driver outputting the voltage of said first sense node to a first output node; and a second tristatable output driver coupled to said second sense node and to said first feedback circuit, said second tristatable output driver outputting the voltage of said second sense node to a second output node; and wherein said first feedback circuit increases a voltage gain of said sense amplifier and decreases a sense output response time at said first and second sense nodes.

3. The sense amplifier of claim 2 wherein said first tristatable output driver has first, second, third and fourth output transistors coupled in series, said second output transistor for receiving a first drive signal, said third output transistor for receiving a second drive signal, said second and third output transistors coupled to said first output node, said first and fourth output transistors controlled by said first sense node, said first output transistor coupled to a power supply, said fourth output transistor coupled to ground;

said second tristatable output driver has fifth, sixth, seventh and eighth output transistors coupled in series, said sixth output transistor for receiving said first drive signal, said seventh output transistor for receiving said second drive signal, said sixth and seventh output transistors coupled to said second output node, said fifth and eighth output transistors controlled by said second sense node, said fifth output transistor coupled to said power supply, said eighth output transistor coupled to said ground; and said first drive signal controls said first precharge circuit.

4. The sense amplifier of claim 3 wherein said first feedback circuit is controlled by a first inner node located between said first and second output transistors and by a second inner node located between said fifth and sixth output transistors, said first feedback circuit being coupled to said first and second inner nodes wherein said first and second inner nodes disable the first feedback circuit during a standby period and between read and write cycles.

5. The sense amplifier of claim 4 wherein (a) said first differential input circuit includes first and second n-channel transistors, said first n-channel transistor having its source coupled to said first sense node and its gate for receiving said first input signal, said second n-channel transistor having its source coupled to said second sense node and its gate for receiving said second input signal;

(b) said first cross-coupled latch includes third and fourth n-channel transistors, said third n-channel transistor having its gate coupled to said second sense node, its drain coupled to said first sense node and its source coupled to ground, said fourth n-channel transistor having its gate coupled to said first sense node, its drain coupled to said second sense node and its source coupled to said ground; and (c) said first feedback circuit includes first and second p-channel transistors, said first p-channel transistor having its gate coupled to said first inner node, its drain coupled to said source of said first n-channel transistor, and its source coupled to a drain of said first n-channel transistor, said second p-channel transistor having its gate coupled to said second inner node, its drain coupled to said source of said second n-channel transistor and its source coupled to a drain of said second n-channel transistor.

6. The sense amplifier of claim 3 wherein said first precharge circuit includes a fifth, sixth and seventh n-channel transistors whose gates are coupled to said first drive signal, said fifth n-channel transistor for precharging said first sense node, said seventh n-channel transistor for precharging said second sense node, said sixth n-channel transistor for equalizing said voltage of said first sense node to said voltage of said second sense node, said fifth n-channel transistor having its drain coupled to said first sense node and its source coupled to said ground, said seventh n-channel transistor having its drain coupled to said second sense node and its source coupled to said ground, and said sixth n-channel transistor being coupled to said first and second sense nodes.

7. The sense amplifier of claim 1 further comprising a first enable circuit for supplying power to said first differential input circuit, to said first feedback circuit, and to said cross-coupled latch, said first enable circuit coupled to a power supply.

8. The sense amplifier of claim 5 further comprising:

a second differential input circuit coupled to said first and second sense nodes, said second differential input circuit detecting third and fourth input signals and producing second voltage levels from the detected voltage levels of said third and fourth input signals; and a second feedback circuit coupled to said driver circuit, to said second differential input circuit and to said first and second sense nodes, said second feedback circuit increasing the voltage gain and decreasing the sense output response time at said first and second sense nodes, said second feedback circuit controlled by said driver circuit wherein when said first differential input circuit and said first feedback circuit are selected, said second differential input circuit and said second feedback circuit are inactive, when said second differential input circuit and said second feedback circuit are selected, said first differential input circuit and said first feedback circuit are inactive, and said first and second differential input circuits and said first and second feedback circuits share said cross-coupled latch and said first precharge circuit.

9. The sense amplifier of claim 8 further comprising:
a first enable circuit for supplying power to said first differential input circuit, to said first feedback circuit, to said cross-coupled latch and to said first precharge circuit, said first enable circuit coupled to a power supply; and
a second enable circuit for supplying power to said second differential input circuit, to said second feedback circuit, to said cross-coupled latch and to said first precharge circuit, said second enable circuit coupled to said power supply.

10. The sense amplifier of claim 8 wherein said second differential input circuit includes an eighth and ninth n-channel transistors,
said eighth n-channel transistor having its source coupled to said first sense node and its gate for receiving said third input signal,
said ninth n-channel transistor having its source coupled to said second sense node and its gate for receiving said fourth input signal.

11. The sense amplifier of claim 10 further comprising:
(a) a first write circuit including:
a first pass circuit controlled by a first write signal, said first pass circuit for transferring a signal at said second output node to said gate of said first n-channel transistor of said first differential input circuit, said first pass circuit coupled to said gate of said first n-channel transistor of said first differential input circuit and to said second output node, and
a second pass circuit controlled by said first write signal, said second pass circuit for transferring a signal at said first output node to said gate of said second n-channel transistor of said first differential input circuit, said second pass circuit coupled to said gate of said second n-channel transistor of said first differential input circuit and to said first output node; and
(b) a second write circuit including:
a third pass circuit controlled by a second write signal, said second pass circuit for transferring a signal at said second output node to, said gate of said eighth n-channel transistor of said second differential input circuit, said third pass circuit coupled to said gate of said eighth n-channel transistor of said second differential input circuit and to said second output node, and
a fourth pass circuit controlled by said second write signal, said fourth pass circuit for transferring a signal at said first output node to said gate of said ninth n-channel transistor of said second differential input circuit, said fourth pass circuit coupled to said gate of said ninth n-channel transistor of said second differential input circuit and to said first output node.

12. The sense amplifier of claim 3 wherein said first feedback circuit is controlled by a first inner node located between said third and fourth output transistors and by a second inner node located between said seventh and eighth output transistors, said first feedback circuit being coupled to said first and second inner nodes.

13. The sense amplifier of claim 12 wherein
(a) said first differential input circuit includes a first and second n-channel transistors,
said first n-channel transistor having its source coupled to said first sense node and its gate for receiving said first input signal,
said second n-channel transistor having its source coupled to said second sense node and its gate for receiving said second input signal; and
(b) said first feedback circuit includes a first and second p-channel transistors,
said first p-channel transistor having its gate coupled to said first inner node, its drain coupled to said source of said first n-channel transistor, and its source coupled to a drain of said first n-channel transistor,
said second p-channel transistor having its gate coupled to said second inner node, its drain coupled to said source of said second n-channel transistor and its source coupled to a drain of said second n-channel transistor.

14. The sense amplifier of claim 13 further comprising:
a first pull-up transistor having its gate coupled to said second drive signal, its source coupled to said power supply and its drain coupled to said gate of said first p-channel transistor, said first pull-up transistor for preventing said gate of said first p-channel transistor from floating; and
a second pull-up transistor having its gate coupled to said second drive signal, its source coupled to said power supply and its drain coupled to said gate of said second p-channel transistor, said second pull-up transistor for preventing said gate of said second p-channel transistor from floating.

15. The sense amplifier of claim 14 further comprising:
a first delay circuit for slowing activation of said gate of said first p-channel transistor, said first delay circuit coupled to said gate of said first p-channel transistor; and
a second delay circuit for slowing activation of said gate of said second p-channel transistor, said second delay circuit coupled to said gate of said second p-channel transistor.

16. The sense amplifier of claim 15 further comprising:
a second differential input circuit coupled to said first and second sense nodes, said second differential input circuit detecting a third and fourth input signals and producing second voltage levels from the detected voltage levels of said third and fourth input signals;
a second feedback circuit coupled to said driver circuit, to said second differential input circuit and to said first and second sense nodes, said second feedback circuit controlled by said driver circuit
wherein when said first differential input circuit and first feedback circuit are selected, said second differential input circuit and second feedback circuit are inactive,
when said second differential input circuit and second feedback circuit are selected, said first differential input circuit and first feedback circuit are inactive, and
said first and second differential input circuits and said first and second feedback circuits share said cross-coupled latch and said first precharge circuit.

17. The sense amplifier of claim 16 wherein
(a) said second differential input circuit includes a third and fourth n-channel transistors,
said third n-channel transistor having its source coupled to said first sense node and its gate for receiving said third input signal,
said fourth n-channel transistor having its source coupled to said second sense node and its gate for receiving said fourth input signal; and
(b) said second feedback circuit includes a third and fourth p-channel transistors,
said third p-channel transistor having its gate coupled to said first inner node, its drain coupled to said source of said third n-channel transistor, and its source coupled to a drain of said third n-channel transistor, said fourth p-channel transistor having its gate coupled to said second inner node, its drain coupled to said source of said fourth n-channel transistor and its source coupled to a drain of said fourth n-channel transistor.

18. The sense amplifier of claim 1 further comprising:

a second differential circuit coupled to a fifth I/O node and a sixth I/O node and to said first and second sense nodes, said second differential circuit for sensing a fifth and a sixth input signal at said fifth and sixth I/O nodes; and a second feedback circuit coupled to said driver circuit, to said second differential input circuit and to said first and second sense nodes, said second feedback circuit controlled by said driver circuit wherein said first differential circuit is coupled to a first I/O node and a second I/O node to sense said first and second input signals;

and said driver circuit coupled to a third I/O node and a fourth I/O node.

19. The sense amplifier of claim 18 wherein said third IO node is for coupling to one of said second and sixth IO nodes;

said fourth IO node is for coupling to one of said first and fifth IO nodes;

when said first and second IO nodes are used as input nodes, said third and fourth IO nodes are used as output nodes;

when said fifth and sixth IO nodes are used as input nodes, said third and fourth IO nodes are used as output nodes; and when said third and fourth IO nodes are used as input nodes, either said first and second IO nodes or said fifth and sixth IO nodes are used as output nodes when said first differential circuit and said first feedback circuit are active, said second differential circuit and said second feedback circuit are inactive;

when said second differential circuit and said second feedback circuit are active, said first differential circuit and said first feedback circuit are inactive.

20. A method for operating a sense amplifier comprising the steps of:

detecting input signals;

providing feedback signals to feedback transistors from a driver circuit to increase a voltage gain of said sense amplifier and to decrease a sense output response time at sense nodes, said driver circuit coupled to said sense nodes; and outputting a voltage at said sense nodes to output nodes.

* * * * *